(12) United States Patent
Koike et al.

(10) Patent No.: US 6,757,155 B2
(45) Date of Patent: Jun. 29, 2004

(54) ELECTRONIC CIRCUIT BOARD CASE

(75) Inventors: Tatsuo Koike, Kakuda (JP); Mitsuhiro Ito, Takanezawa-machi (JP)

(73) Assignee: Keihin Corporation, Tokyo (JP)

( * ) Notice: Subject to any disclaimer, the term of this patent is extended or adjusted under 35 U.S.C. 154(b) by 0 days.

(21) Appl. No.: 10/358,152

(22) Filed: Feb. 5, 2003

(65) Prior Publication Data

US 2003/0147204 A1 Aug. 7, 2003

(30) Foreign Application Priority Data

Feb. 6, 2002 (JP) ........................................ 2002-028962

(51) Int. Cl.⁷ ................................................ H02B 1/00
(52) U.S. Cl. ........................ 361/600; 361/601; 361/752; 714/52.1
(58) Field of Search ................................ 361/601, 679, 361/704, 719, 752; 174/52.1; 220/4.02

(56) References Cited

U.S. PATENT DOCUMENTS

| | | | | |
|---|---|---|---|---|
| 5,111,362 A | * | 5/1992 | Flamm et al. | 361/736 |
| 5,691,878 A | * | 11/1997 | Ahn et al. | 361/674 |
| 5,944,210 A | * | 8/1999 | Yetter | 220/4.21 |
| 5,995,380 A | * | 11/1999 | Maue et al. | 361/826 |
| 6,111,760 A | * | 8/2000 | Nixon | 361/814 |
| 6,239,986 B1 | * | 5/2001 | Otsuka | 361/796 |
| 6,300,564 B1 | * | 10/2001 | Moraes et al. | 174/52.1 |
| 6,315,142 B1 | * | 11/2001 | Kitamura et al. | 220/4.02 |
| 6,343,707 B2 | * | 2/2002 | Cheng | 220/4.24 |
| 6,435,882 B1 | * | 8/2002 | Pitou | 439/70 |

FOREIGN PATENT DOCUMENTS

| | | | |
|---|---|---|---|
| JP | 04056195 A | * 2/1992 | ............ H05K/5/02 |
| JP | 05-283876 | 10/1993 | |
| JP | 07-249881 | 9/1995 | |
| JP | 07-302984 | 11/1995 | |
| JP | 09-230069 | 9/1997 | |
| JP | 2586966 | 10/1998 | |

* cited by examiner

Primary Examiner—Boris Chervinsky
(74) Attorney, Agent, or Firm—Westerman, Hattori, Daniels & Adrian, LLP

(57) ABSTRACT

A case for housing an electronic circuit board having a case body formed with an opening and a sealing member for sealing the opening, wherein one of the case body and the sealing member is formed with one fastening member composed of an elastically deformable leg and a projection continuous therewith for enabling attachment of the sealing member to the case body by engagement of the fastening member with a prescribed region of the other. The projection is continuous with the leg and has a first surface formed to contact the prescribed region at a prescribe angle and a second surface continuous with the first surface and formed parallel to the prescribed region. With this, molding error can be tolerated and stress owing to volumetric variation produced by temperature change or to vibration can be readily coped with. Moreover, it is possible to prevent release of the engagement of the projection with the prescribed region, and thus to prevent separation of the sealing member from the case body.

7 Claims, 16 Drawing Sheets

FIG. 10

|  | MEASURED STRESS/ PERMISSIBLE MAXIMUM STRESS ×100 [%] |
|---|---|
| IN FASTENING BOARD | 8.6 |
| AFTER BOARD ATTACHED | 47.4 |
| VIBRATION TEST | 0.23 |

ELECTRONIC CIRCUIT BOARD CASE

BACKGROUND OF THE INVENTION

1. Field of the Invention

This invention relates to an electronic circuit board case, particularly to a case for housing an electronic circuit board, more particularly to a case for housing an electronic circuit board composed of a case body formed with an opening at at least one end and a sealing member for sealing the opening.

2. Description of the Related Art

In a case for housing an electronic circuit board composed of a case body formed with an opening at at least one end and a sealing member for sealing the opening, the sealing member is commonly attached to the case body using a hook-like fastening member (catch 100) such as shown in FIG. 18. The catch 100 comprises an elastically deformable leg 102 and a projection 104 continuous therewith. It is formed on one or the other of the case body and the sealing member.

The sealing member is attached to the case body by engaging the projection 104 of the catch 100 with a prescribed region 106 of the case body or the sealing member, as the case may be.

The catch 100 of the prior art is, however, disadvantageous in the point that should the vertical distance h from the contact surface 108 between the case body and the sealing member to the prescribed region 106 be formed small (as indicated by the doted lines in the drawing) owing to molding error, play will arise in the lateral and vertical directions.

In order to prevent this drawback, the height h of the catch 100 must be strictly controlled. Such strict dimensional control is disadvantageous from the cost aspect. In addition, the case body and sealing member (including the catch 100) experience repeated thermal expansion and thermal contraction when used in an environment subject to extreme temperature changes. If the case for housing an electronic circuit board is designed based on the dimensions during thermal expansion, lateral and vertical play is liable to arise during thermal contraction.

On the other hand, if the design is based on the dimensions during thermal contraction, excessive stress comes to act on, and may break, the catch 100 during thermal expansion. The catch 100 also becomes susceptible to damage under the action of large stress produced by vibration or the like.

The electronic circuit board can also be fastened at a prescribed location in the case by clamping it between the case body and the sealing member (cover or the like), as taught by Japanese Laid-Open Patent Application No. 9(1997)-230069, No. 7(1995)-302984, No. 7(1995)-249881 and No. 5(1993)-283876, and Japanese Utility Model Registration No. 2586966. This expedient encounters the same disadvantage, however, owing to molding error in the electronic circuit board thickness and/or volumetric variation caused by temperature changes.

Moreover, an adhesive is sometimes applied at the contact surface 108 between the case body and the sealing member in order to improve watertightness and fastening strength. When this is done, the same disadvantage is also likely to occur owing to irregular adhesive coating thickness and change in the height h produced by thermal expansion of the adhesive coating.

SUMMARY OF THE INVENTION

A first object of the present invention is therefore is to overcome the aforesaid problem by providing a case for housing an electronic circuit board that can tolerate greater molding error than the prior art and that can readily cope with stress produced by temperature change and vibration.

After the case body and the sealing member have been fastened together, there is a possibility of the sealing member separating from the case body should someone such as a worker touch the leg 102 with a force strong enough to elastically deform the leg 102 and release the engagement between the prescribed region 106 and the projection 104.

A second object of the present invention is therefore to provide a case for housing an electronic circuit board that prevents a worker or the like from contacting the leg and thus prevents separation of the sealing member from the case body.

The case for housing an electronic circuit board should preferably enable removal of the sealing member from the case body at the time of servicing and inspection.

A third object of the present invention is therefore to provide a case for housing an electronic circuit board that prevents separation of the sealing member from the case body but makes their separation possible as desired when necessary.

In order to achieve the foregoing objects, this invention in a first aspect provides a case for housing an electronic circuit board comprising: a case body formed with an opening at at least one end and a sealing member for sealing the opening, wherein one of the case body and the sealing member is formed with at least one fastening member composed of an elastically deformable leg and a projection continuous therewith for enabling attachment of the sealing member to the case body by engagement of the fastening member with a prescribed region of the other of the case body and the sealing member, the projection being continuous with at least the leg and having a first surface formed to contact the prescribed region at a prescribe angle and a second surface continuous with the first surface and formed parallel or substantially parallel to the prescribed region.

The projection of the fastening member (catch) is constituted to have the first surface that is continuous with at least the elastically deformable leg and is formed to contact the prescribed region to be engaged at a prescribed angle. Specifically, the prescribed region and the first surface form the prescribed angle and contact each other tangentially. Since the tangent of the first surface and the prescribed region is variable within the range of the first surface, molding error can be tolerated (absorbed) and stress owing to volumetric variation produced by temperature change or to vibration can be readily coped with. Moreover, due to the provision of the second surface formed continuous with the first surface to lie parallel or substantially parallel to the prescribed region, it is possible to prevent the tangent from leaving the range of the first surface, i.e., prevent release of the engagement of the projection with the prescribed region, and thus to prevent separation of the sealing member from the case body.

In a second aspect, this invention provides a case for housing an electronic circuit board, wherein the second surface is formed so as to lie parallel or substantially parallel to the prescribed region when the first surface contacts the prescribed region at or near the boundary with the second surface.

Since the second surface is formed so as to lie parallel or substantially parallel to the prescribed region when the first surface contacts the prescribed region at or near the boundary with the second surface, the tangent between the first surface and the prescribed region is reliably prevented from leaving the range of the first surface.

In a third aspect, this invention provides a case for housing an electronic circuit board, wherein one of the case body and the sealing member is provided with a cover for covering all or part of the leg when the projection is engaged with the prescribed region.

Since one of the case body and the sealing member is provided with a cover for covering all or part of the leg when the projection is engaged with the prescribed region, i.e., when the sealing member is attached to the case body, contact with the leg by a worker or the like is prevented, thereby preventing separation of the sealing member from the case body.

In a fourth aspect, this invention provides a case for housing an electronic circuit board, wherein one of the case body and the sealing member is formed with the leg at a location toward the case interior from a side wall.

Since one of the case body and the sealing member is formed with the leg at a location toward the case interior from a side wall, an effect similar to that of the third aspect is obtained, whereby contact with the leg by a worker or the like is prevented, thereby preventing separation of the sealing member from the case body.

In a fifth aspect, a case for housing an electronic circuit board is provided, wherein, in one of the case body and the sealing member, the prescribed region is a region within a space defined by the external shape of the case or sealing member and continuous with the external space.

Since in one of the case and the sealing member, the prescribed region is a region (location) within a space defined by the external shape of the case or sealing member and continuous with the external space, the sealing member can be prevented from separating from the case body while enabling its detachment whenever required.

In a sixth aspect, this invention provides a case for housing an electronic circuit board, wherein at least one first rib for mounting the electronic circuit board is formed in the case body and at least one second rib is formed in the sealing member, the first rib and the second rib clamping the electronic circuit board when the sealing member is attached to the case body.

Since at least one first rib for mounting the electronic circuit board is formed in the case body and at least one second rib is formed in the sealing member and the first and second ribs clamp the electronic circuit board when the sealing member is attached to the case body, the electronic circuit board can be reliably fastened at the prescribed location in the case.

In a seventh aspect, this invention provides a case for housing an electronic circuit board, wherein a recession or ridge is formed at the periphery of the opening of the case body and a ridge or recession for meshing with said recession or ridge so as to leave a prescribed intervening gap at which adhesive can be applied is formed in the sealing member.

Since a recession or ridge is formed at the periphery of the opening of the case body and a ridge or recession for meshing with said recession or ridge so as to leave a prescribed intervening gap at which adhesive can be applied is formed in the sealing member, watertightness and fastening strength can be enhanced.

BRIEF DESCRIPTION OF THE DRAWINGS

The objects and advantages of the invention will be made apparent with reference to the following descriptions and drawings, in which:

FIG. 10 is a table showing stress acting on the board fastening catches when the board shown in FIG. 1 is fastened;

DETAILED DESCRIPTION OF THE PREFERRED EMBODIMENTS

A case for housing an electronic circuit board according to an embodiment of this invention and a method of producing an electronic circuit unit comprising the case will now be explained with reference to the attached drawings.

Figure 1:
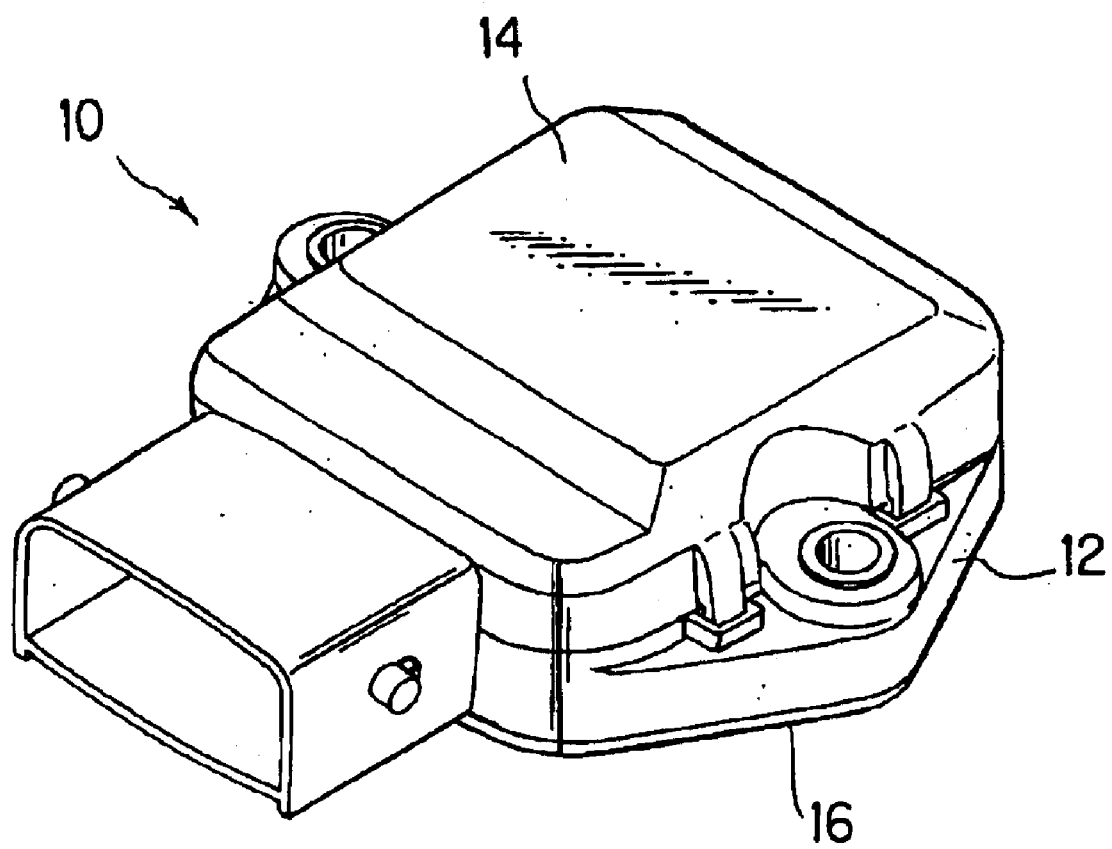
FIG. 1 is a perspective view showing a case for housing an electronic circuit board on which components are fixed according to an embodiment of this invention.

FIG. 1 is a perspective view of the case for housing an electronic circuit board according to this embodiment.

As shown in the drawing, the case for housing an electronic circuit board of this embodiment (hereinafter referred to as "case 10") is composed of a case body 12 made of resin (PBT), a cover 14 also made of resin (PBT), and a heat sink 16 made of a metal having high heat conductivity (aluminum).

Figure 2:
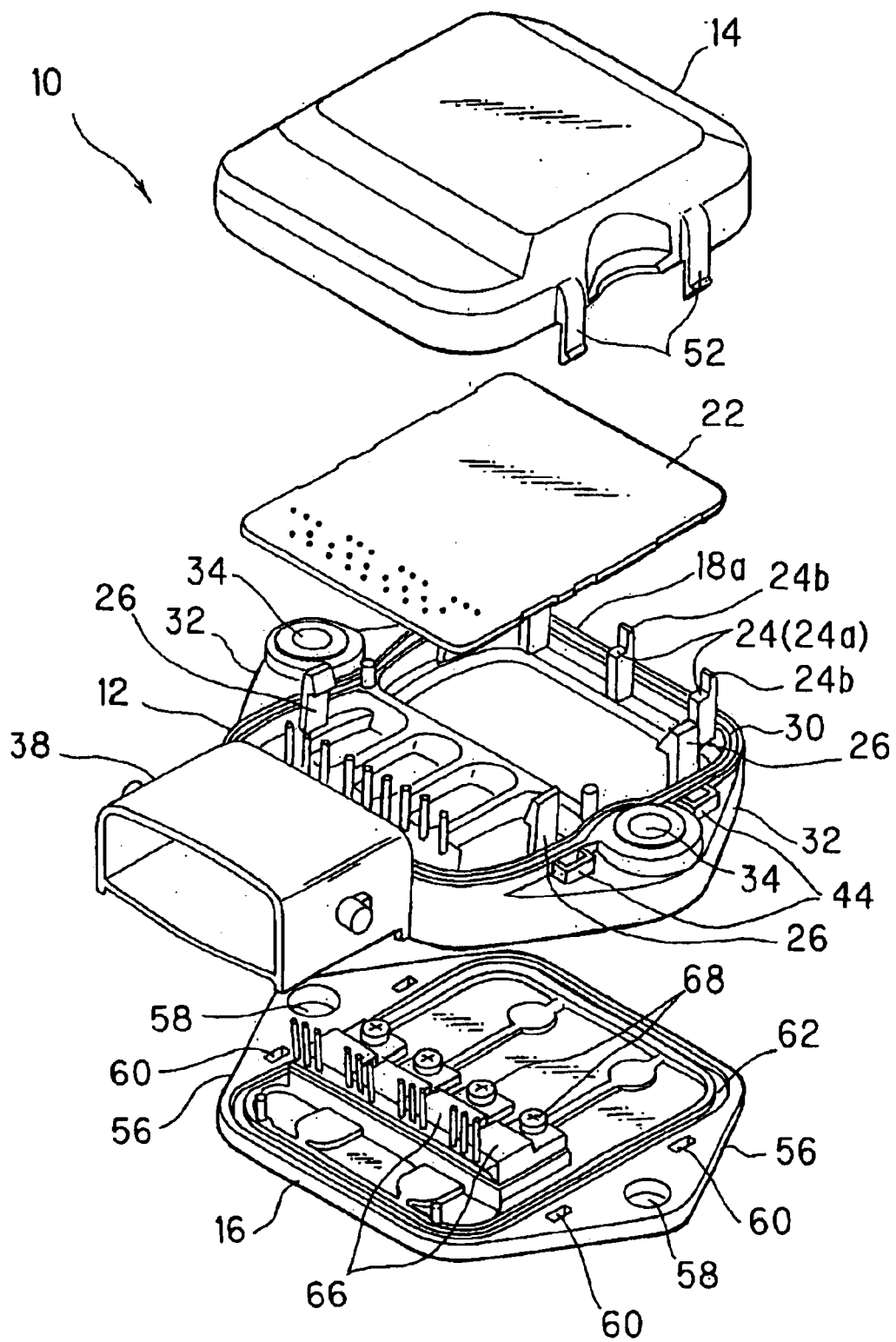
FIG. 2 is a perspective view showing the individual elements of the case shown in FIG. 1.
Figure 3:
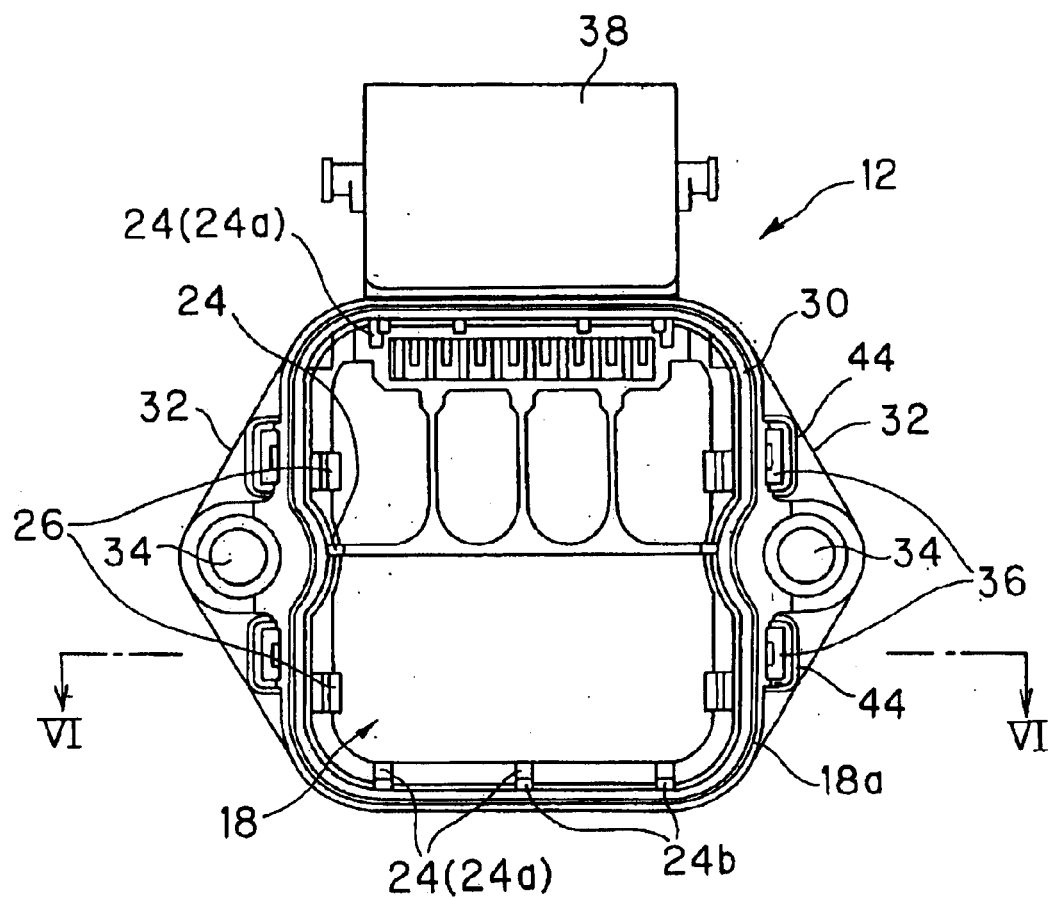
FIG. 3 is a top view of the case body of the case shown in FIG. 1.
Figure 4:
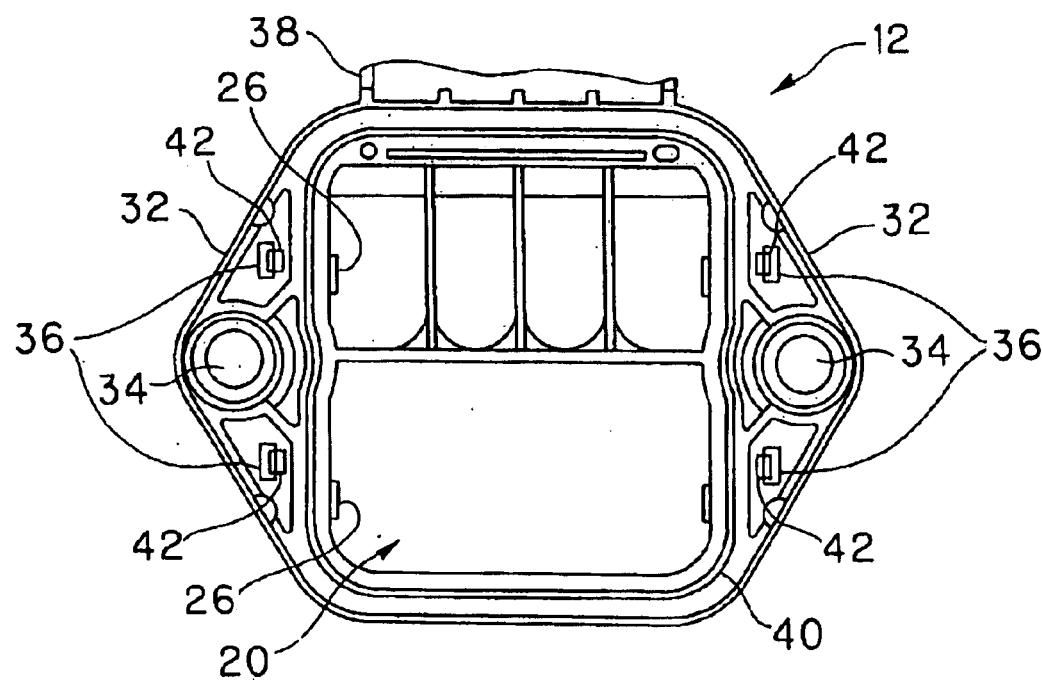
FIG. 4 is a bottom view of the case body of the case shown in FIG. 1.
Figure 5:
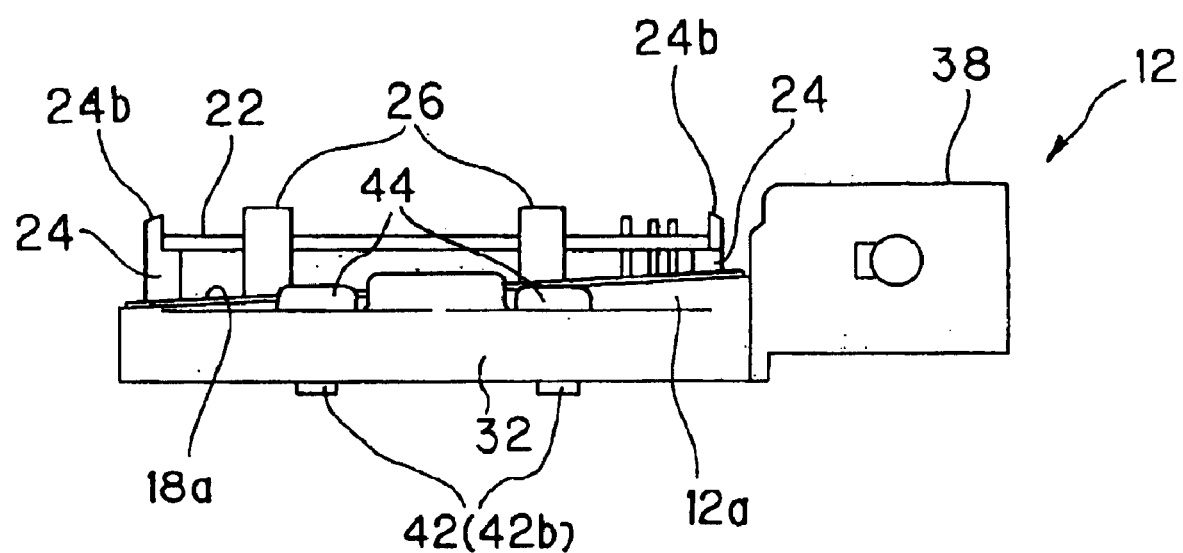
FIG. 5 is side view of the case body of the case shown in FIG. 1.
Figure 6:
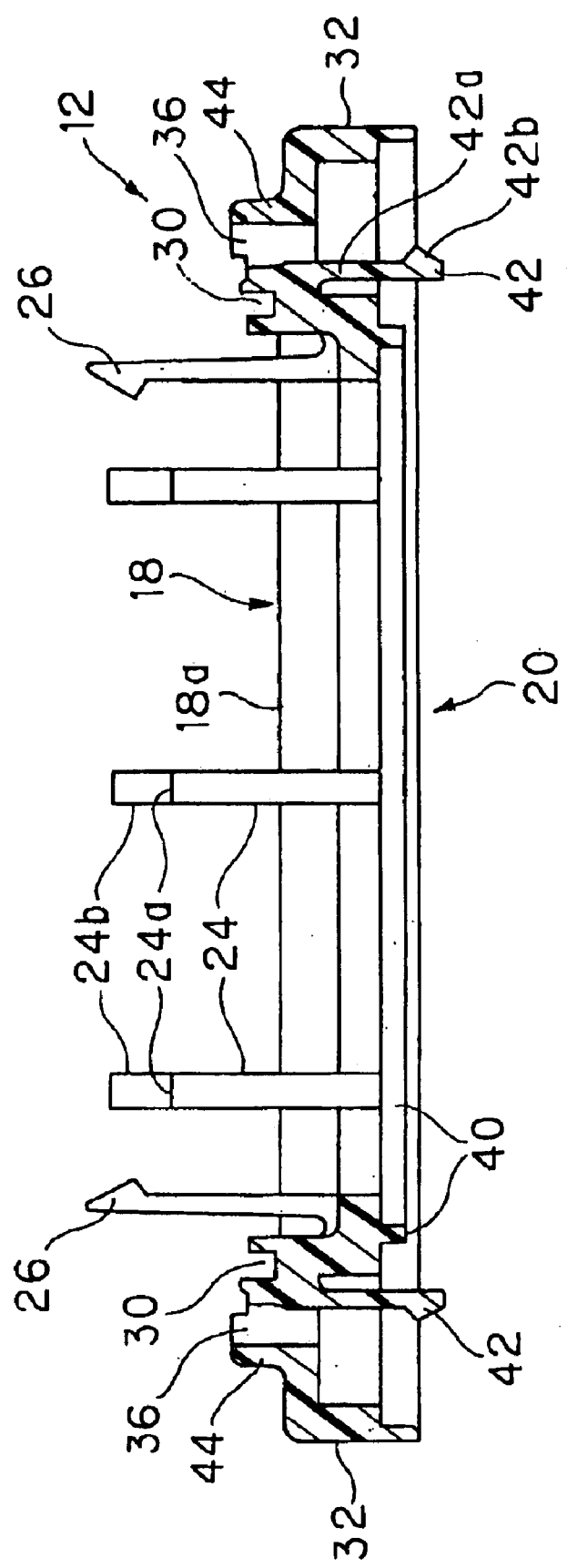
FIG. 6 is a sectional view taken along line VI—VI in FIG. 3.

FIG. 2 is a perspective view showing the individual elements of the case 10 shown in FIG. 1. FIG. 3 is a top view of the case body 12 and FIG. 4 is a bottom view thereof. (Part of a connector explained later has been omitted from these figures). FIG. 5 is side view showing an electronic circuit board in its housed state. FIG. 6 is a sectional view taken along line VI—VI in FIG. 3. The case body 12 will now be explained with reference to FIGS. 2 to 6.

The case body 12 is open over nearly the entire area of its upper surface and lower surface. The opening on the upper surface side will be called "first opening 18" and that on the lower surface side will be called "second opening 20." The case body 12 houses at its interior an electronic circuit board 22 inserted through the first opening 18. (The electronic components mounted on the board 22 are omitted in the drawing.)

The case body 12 encloses an internal space of generally rectangular shape as viewed from the top. A plurality (6) ribs 24 are formed at appropriate locations on the internal space side (inner face) of a side wall 12a. As the cover 14 is also formed with ribs as explained later, the ribs formed on the case body 12 will be called "first ribs." The upper end surfaces 24a of the first ribs 24 serve as mounting surfaces for mounting the board 22. First stops 24b for locating the board 22 are formed at the tops of the upper end surfaces 24a toward the outer side of the case.

The characterizing feature here is that the upper end surfaces 24a are formed upward of the opening edge 18a defining the first opening 18 by a prescribed height. In other words, the opening edge 18a, i.e., the upper end of the side wall 12a of the case body 12, is formed a prescribed height toward the bottom surface side from the upper end surfaces 24a for mounting the board 22. As a result, the board 22 can be fixed to the upper end surfaces 24a (by board fastening catches explained later), the case body 12 as a whole be turned upside down, and the whole surface of the board 22 be coated by dipping in a coating liquid. Reliability is therefore not degraded in the point of insulation property and the like.

In addition, it is possible to prevent application of the coating liquid to prescribed regions constituting coating-prohibited regions of the case body 12, specifically the opening edge 18a. This reduces cost by eliminating the need for case body masking work and prevents the working process from becoming complicated.

Since coating can be carried out with the board 22 fixed to the case body 12, moreover, no jig is required. This further reduces process complexity and cost.

In order to ensure that the coating liquid does not adhere to the opening edge 18a, the aforesaid prescribed height is set to an appropriate value taking into account splashing of the coating liquid when the board 22 is dipped into the coating liquid.

A plurality of board fastening catches (fastening members) 26 for fastening the board 22 are also formed on the inner wall of the case body 12. Specifically, four catches are formed, two each on opposing sides of the inner wall.

Figure 7:
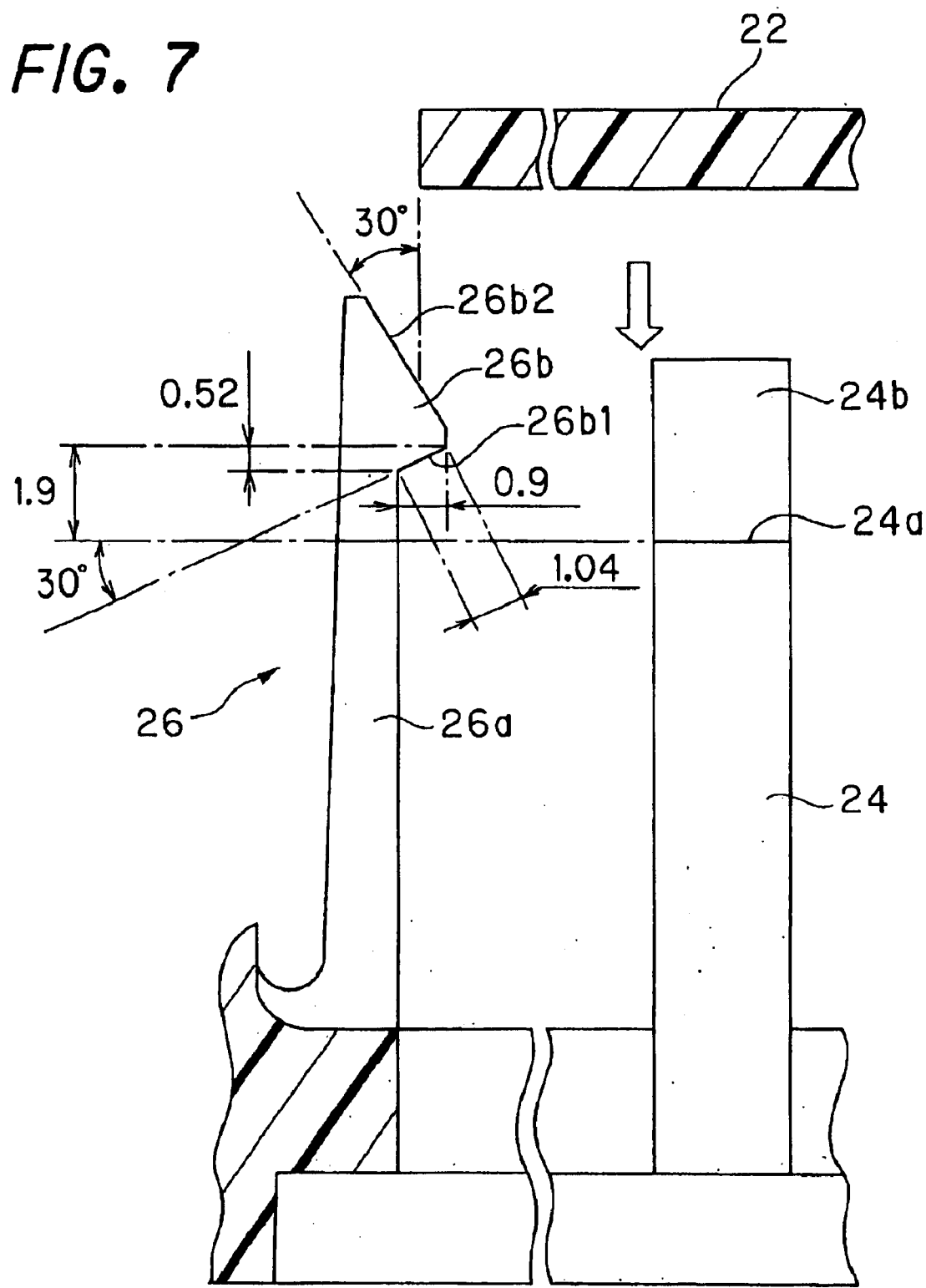
FIG. 7 is a partial enlargement of FIG. 6 for explaining a board fastening catch (fastening member)

The board fastening catches 26 are formed as shown in FIG. 7. FIG. 7 is an enlarged view of a board fastening catch 26.

As illustrated, the board fastening catch 26 comprises an elastically deformable leg 26a and a projection 26b continuous with the leg 26a and projecting toward the board 22, i.e., in the direction of the internal space of the case body 12. The projection 26b is formed at a location upwardly apart from the upper end surface 24a on which the board 22 is mounted by approximately the thickness of the board 22.

The surface that the board 22 contacts when fastened, hereinafter called the "board contact surface 26b1," is tapered toward the internal space side to form an angle of 30 degrees with the upper end surface 24a. The surface 26b2 contacted by the board 22 when it is inserted is tapered to form an angle of 30 degrees with direction of board 22 insertion so as to facilitate the insertion.

As shown in the drawing, the lateral width of the board contact surface 26b1 is 0.9 mm and its vertical width (height) is 0.52 mm. Since, as explained above, the angle relative to the upper end surface 24a, i.e., relative to horizontal, is 30 degrees, the substantial length of the board contact surface 26b1 is 1.04 mm. The maximum distance in the vertical direction between the upper end surface 24a and the board contact surface 26b1 is 1.9 mm (the minimum distance is 1.9-0.52=1.38 mm), and the thickness of the board 22 is 1.6 mm.

Figure 8:
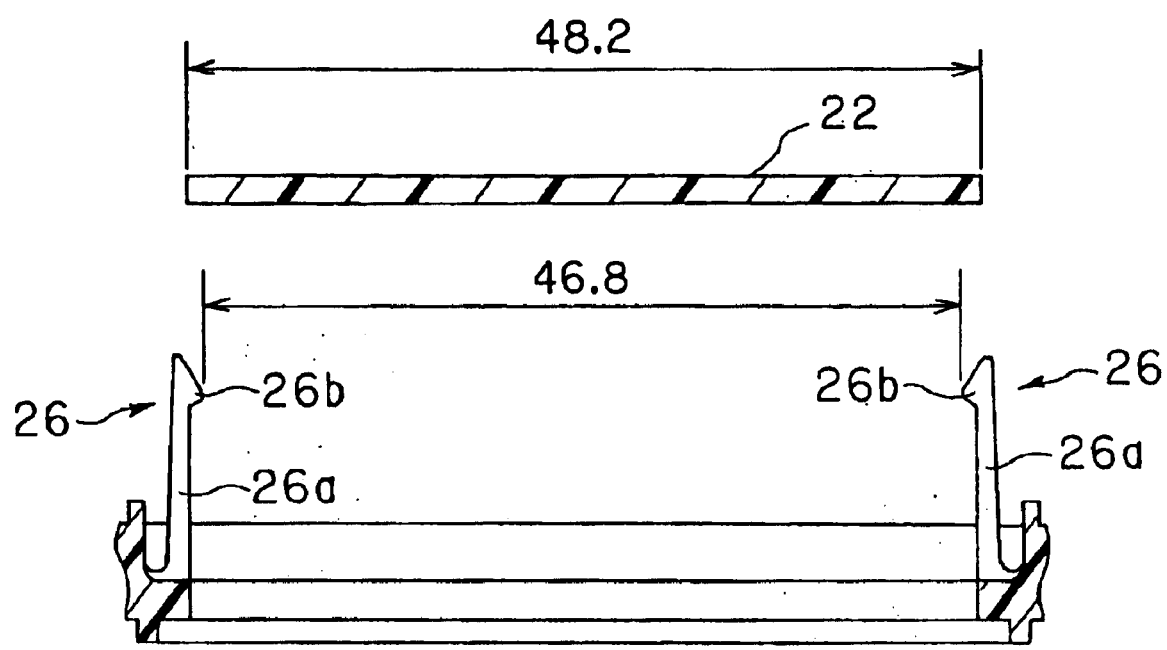
FIG. 8 is a simplified representation of FIG. 6 for explaining the width of a board and the distance between board fastening catches.

FIG. 8 shows the distance between opposing board fastening catches 26 at their legs 26a and at the tips of their projections 26b, and also shows the width of board 22. As shown in the drawing, the distances between the opposing legs 26a and between the tips of the opposing projections 26b are set smaller than the width of the board 22.

Figure 9:
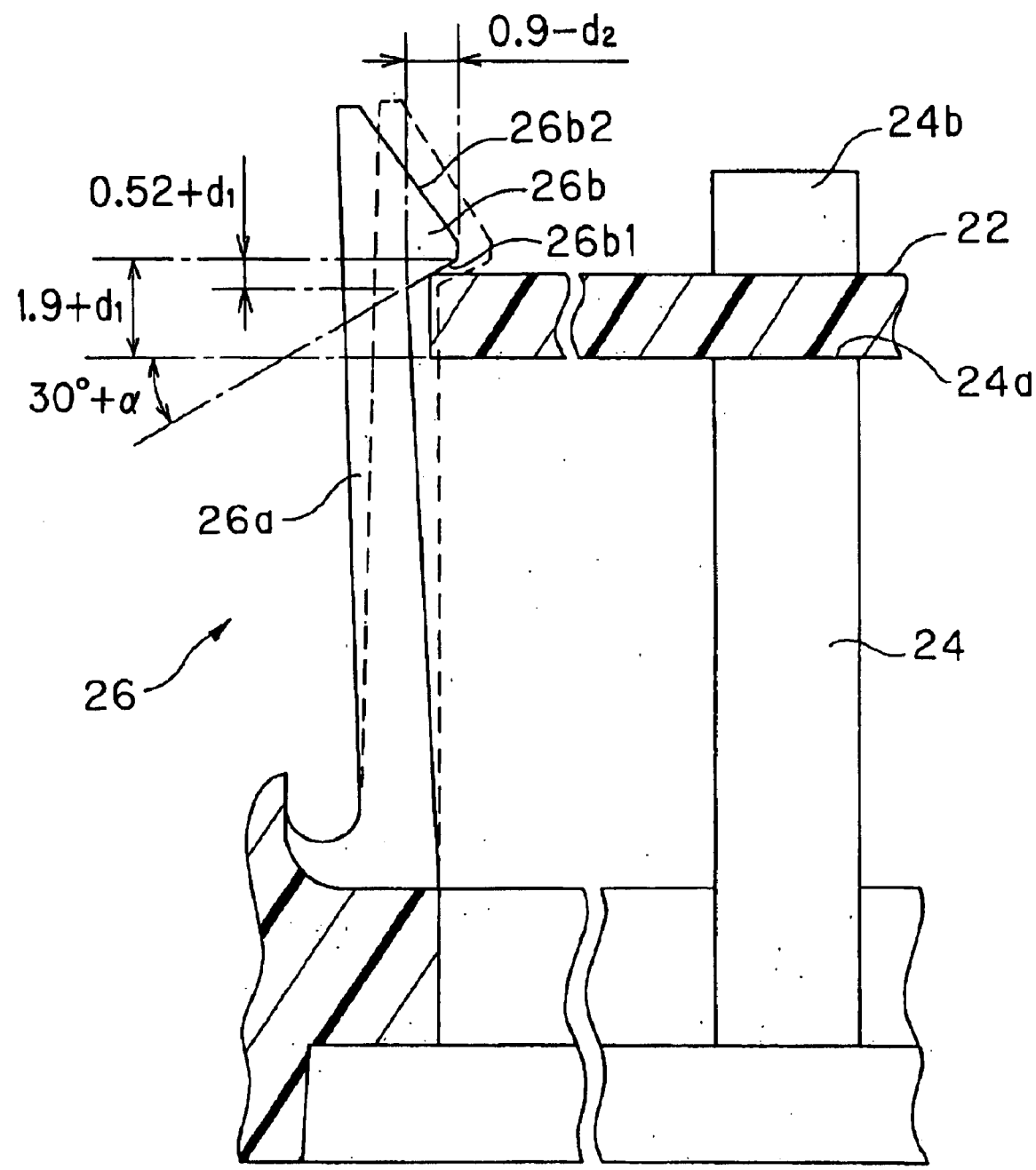
FIG. 9 is an explanatory diagram similar to FIG. 7 showing the fastened state of the board shown in FIG. 1.

FIG. 9 is a diagram for explaining the state of the board fastening catches 26 when the board 22 is fastened. As illustrated, the board 22 is fastened in a prescribed location by clamping it between the upper end surfaces 24a on which it is mounted and the board contact surfaces 26b1 (only one of each shown in FIG. 9). Therefore, so long as the width and thickness of the board 22 can fit within the range of the lateral width and vertical width of the board contact surface 26b1, the board 22 can be clamped between the upper end surfaces 24a and the board contact surfaces 26b1 to achieve the prescribed positioning. The board contact surface 26b1 and the board 22 contact tangentially at a prescribed angle. In other words, the structure is such that the tangent between the board contact surface 26b1 and the board 22 can fall within the range of the board contact surface 26b1. Therefore, molding error of the board 22 and the board fastening catches 26, and volumetric variation cause by temperature change, are tolerable within the range of the lateral width and vertical width of the board contact surface 26b1. The force clamping the board 22 depends on the elasticity of the leg 26a.

The fastening of the board 22 on the upper end surfaces 24a elastically deforms the board fastening catches 26, more precisely the legs 26a. This changes the angle between the upper end surfaces 24a and the board contact surfaces 26b1. (The angle after the change, i.e., the angle between the board 22 and the board contact surface 26b1, is defined as 30 degrees+$\alpha$ degrees). Owing to this angle change, the lateral width and the vertical width of the board contact surface 26b1 changes and the maximum distance in the vertical direction between the upper end surface 24a and the board contact surface 26b1 also changes.

Specifically, the greater the elastic deformation of the leg 26a (i.e., the greater the angle between the upper end surface 24a and the board contact surface 26b1 becomes), the larger becomes the vertical width of the board contact surface 26b1 and the maximum distance between the board contact surface 26b1 and the upper end surface 24 (designated +d1), and the smaller becomes the lateral width of the board contact surface 26b1 (designated -d2).

Since $\sin \theta + \cos \theta$ becomes maximum when $\theta$=45 degrees, maximum molding error and volumetric variation are allowable when the dimensions of the different constituents are defined so that the angle between the upper end surface 24a and the board contact surface 26b1 is 45 degrees when the board 22 is mounted on the upper end surface 24a (i.e., so that $\alpha$ becomes 15 degrees). Otherwise, the angle after fastening can be appropriately set according to the stress applied to the board fastening catches 26 and the board 22.

Assume, for example, that the board 22 has the width of 48.2 mm and thickness of 1.6 mm set out above, Then, assuming a coefficient of thermal expansion of $14\times10^{-6}$ and a temperature variation range of $-40°$ C. to $120°$ C. ($\Delta T = 165°$ C.), it follows that Lateral change=$48.2\times(14\times10^{-6}\times165)$=0.11 mm, Thickness change=$1.6\times(14\times10^{-6}\times165)$=0.0037 mm.

The angle after fastening is therefore preferably set at 45 degrees or less to secure large a large lateral change allowance. Also in the case of use in an environment where large vertical vibration (stress) is applied, the angle after fastening is preferably set at 45 degrees or less so as to eliminate play by pressing the board 22 downward. The inventors conducted various tests taking the foregoing considerations into account. As a result they learned that when the case 10 of this embodiment is installed in the engine compartment of a vehicle—an environment marked by extreme temperature change and strong vertical vibration—it is possible by setting the value of $\alpha$ between 1 and 3 degrees (i.e., setting the angle after fastening between 31 and 33 degrees) to cope readily with the stress produced by volumetric variation owing to temperature change and by vibration and thus to prevent damage to the board fastening catches 26 and detachment of the board 22. FIG. 10 shows measured values of the stress acting on the board fastening catches 26 when the board 22 is fastened in the case body 12 of this embodiment. In this figure, the term "permissible maximum stress" refers to tolerance with respect to instantaneous bending stress, and other permissible maximum stress refers to tolerance with respect to continuous stress (repeated stress). Stress after attachment is the value to be added to the stress produced by the vibration test.

It can be seen from FIG. 10 that the board fastening catch 26 of this embodiment had some leeway, relative to its strength characteristic, in the stress value that could actually be applied. This result, while of course also related to the dimensions of the board fastening catches 26, can be traced largely to the fact the stress acting on the board fastening catches 26 was resolved vertically and laterally owing to the adoption of a structure that resulted in a prescribed angle being formed between the board contact surface 26$b$1 and the upper end surfaces 24$a$ after fastening of the board 22. From the fact that stress generated in the vibration test was small, moreover, it can be seen that the board 22 did not resonate owing to the vibration but was firmly immobilized by the board fastening catches 26.

Even if the board 22 should expand or contract in response to the ambient temperature environment, the board fastening catches 26, specifically the board contact surfaces 26$b$1, will follow these changes to keep the board 22 constantly fixed in place free of slack.

The explanation with reference to FIGS. 2 to 6 will be continued. An annular recession 30 is formed at the outer periphery of the first opening 18. Two flanges 32 of triangular shape as viewed from above are formed on the outside (outer face) of the side wall 12$a$ of the case body 12. Each flange is formed with a bolt hole 34 for insertion of a bolt (not shown) and with two first engagement holes 36 that receive cover fastening catches (explained later) and engage their projections.

A connector 38 is formed integrally with the outer side face (outer wall) of the case body 12 so as to project from the side wall. This configuration ensures that the connector 38 is not applied with coating liquid at the time of coating. It further enables coating to be conducted without using a jig because the board 22 can be fixed over the coating liquid via the case body 12 by fastening the connector 38 to a chuck.

While the connector 38 is formed integrally with the case body 12 in this embodiment, it only needs to be installed at a location where the foregoing purposes can be achieved and can, for example, be provided as a separate body fixed to the case body 12 by bolts or the like.

A first annular ridge 40 is formed at the outer periphery of the second opening 20 on the bottom side of the case body 12. In addition, heat sink fastening catches (fastening members) 42 for fastening the heat sink 16 are formed near the first engagement holes 36. Each heat sink fastening catch 42 is composed of an elastically deformable leg 42$a$ and a projection 42$b$ continuous therewith. It is formed with a surface 42$b$2 contacted by the heat sink 16 during fastening, a surface that tangentially contacts a prescribed region (explained later) of the heat sink 16 at a prescribed angle after it has been fastened (hereinafter called "heat sink contact surface 42$b$1"), and a horizontal surface 42$b$3 formed continuously with these surfaces and projecting in the horizontally outward direction of the case. The heat sink fastening catches 42 will be explained in more detail later.

The explanation of the upper surface side of the case body 12 will be continued. Covers 44 for covering the legs of cover fasting catches (explained later) are formed above the first engagement holes 36. This will be explained in more detail later.

Figure 11:
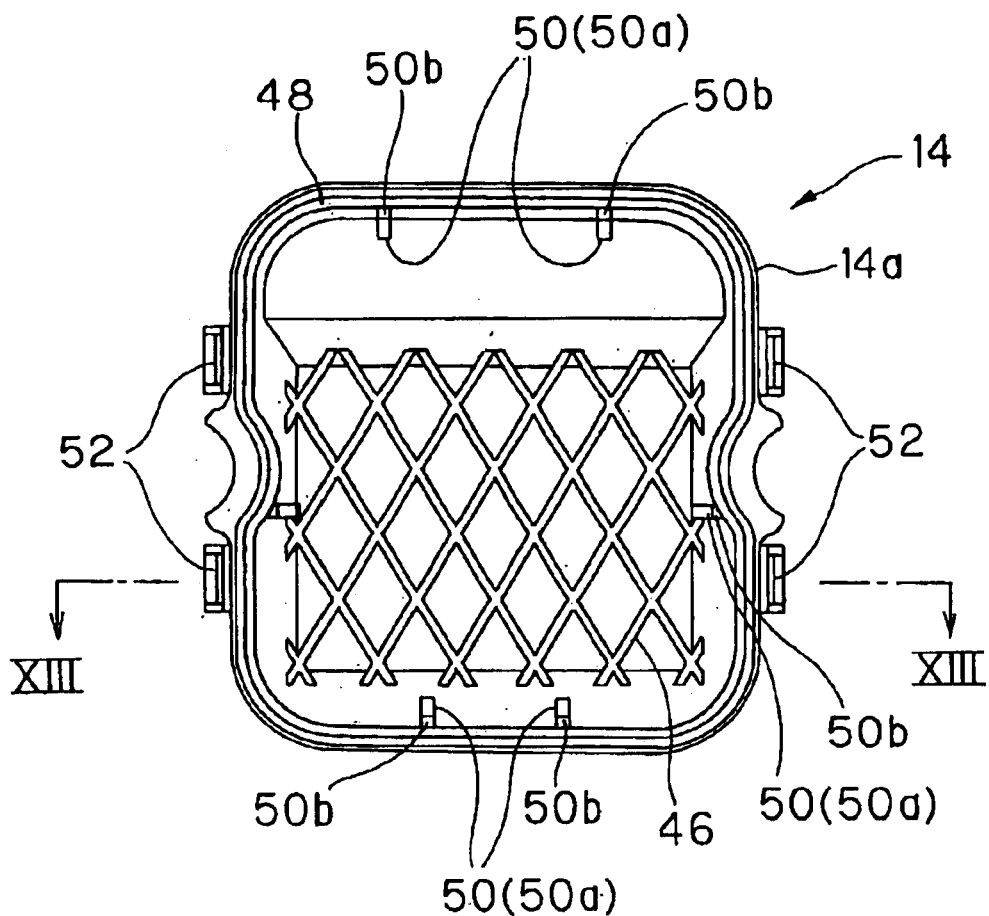
FIG. 11 is a bottom view of a cover of the case shown in FIG. 1.
Figure 12:
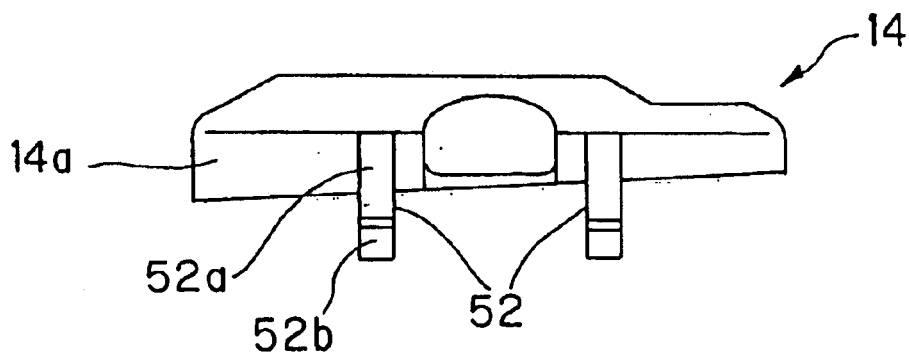
FIG. 12 is a side view of the cover of the case shown in FIG. 1.
Figure 13:
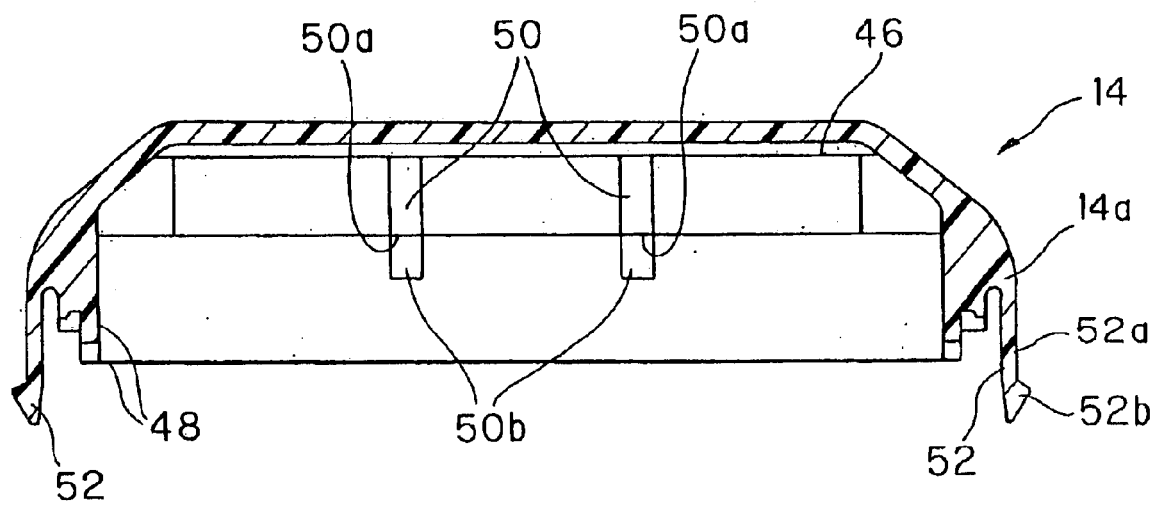
FIG. 13 is an enlarged sectional view taken along XIII—XIII in FIG. 11.

The cover 14 will now be explained. FIG. 11 is a bottom view of the cover 14 (view from the underside) and FIG. 12 is a side view thereof. FIG. 13 is an enlarged sectional view taken along XIII—XIII in FIG. 11. The explanation will be made with reference to FIGS. 2, 11 and 13.

The cover 14 is formed to have a rectangular shape as viewed from the bottom. The bottom surface of its side wall is congruent with the opening edge 18$a$ that defines the first opening of the case body 12. Part of the upper surface protrudes upwardly to secure space for accommodating electronic components when the cover 14 is attached to the case body 12. Part of the upwardly protruding surface is reinforced with crosshatched ribs 46.

The aforesaid bottom surface of the side wall of the cover 14 is formed at a location corresponding to the first annular recession 30 of the case body 12 with a second annular ridge 48 for insertion in the first annular recession 30. Further, a plurality (4) of second ribs 50 are formed at appropriate locations on the internal space side (inner face) of the side wall.

The second ribs 50 are formed so that when the cover 14 is attached to the case body 12, the lower end surfaces 50$a$ of the second ribs 50 are situated above the upper end surfaces 24$a$ of the first ribs 24 by a distance equal to the thickness of the board 22. In other words, when the cover 14 is attached to the case body 12, the board 22 is clamped between the upper end surfaces 24$a$ of the first ribs 24 and the lower end surfaces 50$a$ of the second ribs 50. Second stops 50$b$ for locating the board 22 are formed at outward locations of the cover from the lower end surfaces 50$a$.

Cover fastening catches (fastening members) 52 are formed at the outward sidewall 14$a$ (outer wall) of the cover 14 at locations corresponding to the first engagement holes 36 of the case body 12. Similarly to the heat sink fastening catch 42, each cover fastening catch 52 is composed of an elastically deformable leg 52$a$ and a projection 52$b$ continuous therewith. The projection 52$b$ is formed with a surface 52$b$2 contacted during fastening of the cover 14 to the case body 12, a surface that tangentially contacts a prescribed region (explained later) of the case body 12 at a prescribed angle after it has been fastened (hereinafter called "case body contact surface 52$b$1"), and a horizontal surface 52$b$3

(explained later) formed continuously with these surfaces and projecting in the horizontally outward direction of the case.

Figure 14:
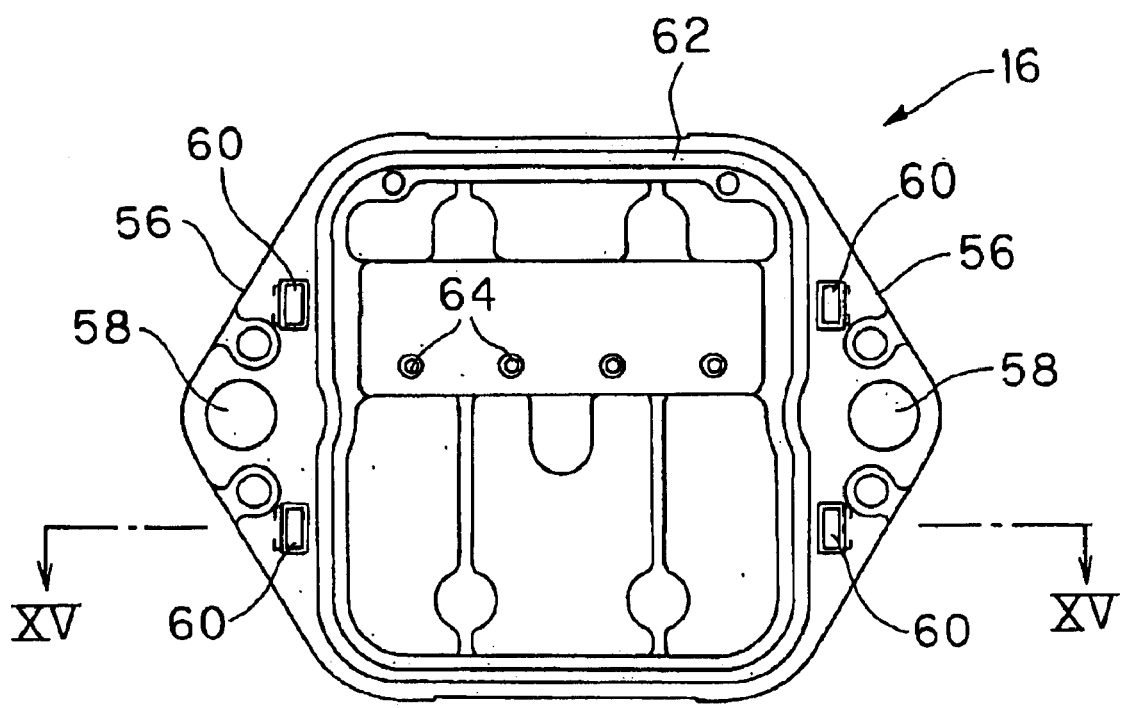
FIG. 14 is a top view of a heat sink of the case shown in FIG. 2.
Figure 15:
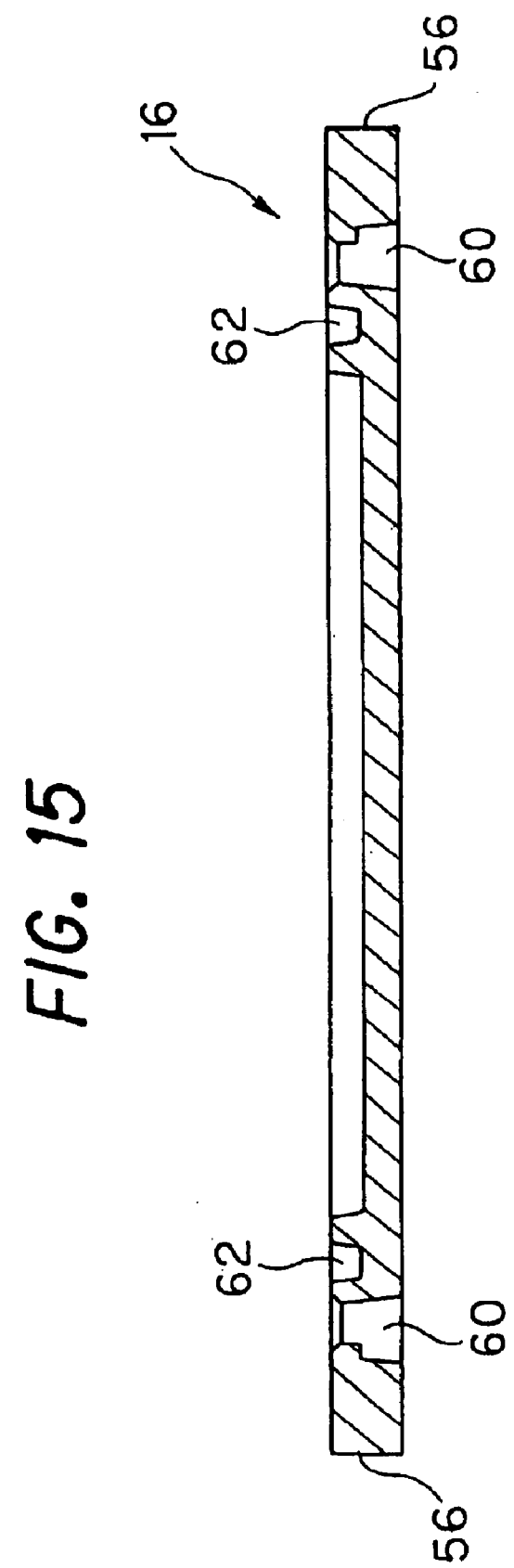
FIG. 15 is an enlarged side view taken along line XV—XV in FIG. 14.

FIG. 14 is a top view of the heat sink 16 and FIG. 15 is an enlarged side view thereof taken along line XV—XV in FIG. 14. The heat sink 16 will now be explained with reference to FIGS. 2, 14 and 15.

The heat sink 16 is formed to have a hexagonal shape as viewed from the top and is equipped on opposite sides with two generally triangular heat sink flanges 56. Each heat sink flange 56 is formed with a heat sink bolt hole 58 at a location corresponding to one of the bolt holes 34 of the case body 12 and is also formed with two second engagement holes 60 for receiving one of the heat sink fastening catches 42 and engaging the projection 42b.

A second annular recession 62 for receiving the first annular ridge 40 of the case body 12 is formed at a location corresponding to the first annular ridge 40. A plurality (4) bolt holes 64 for fastening electronic components are formed at appropriate locations of the heat sink 16 and, as shown in FIG. 2, heat-generating electronic components such as power transistors 66 are fastened with bolts 68.

Figure 16:
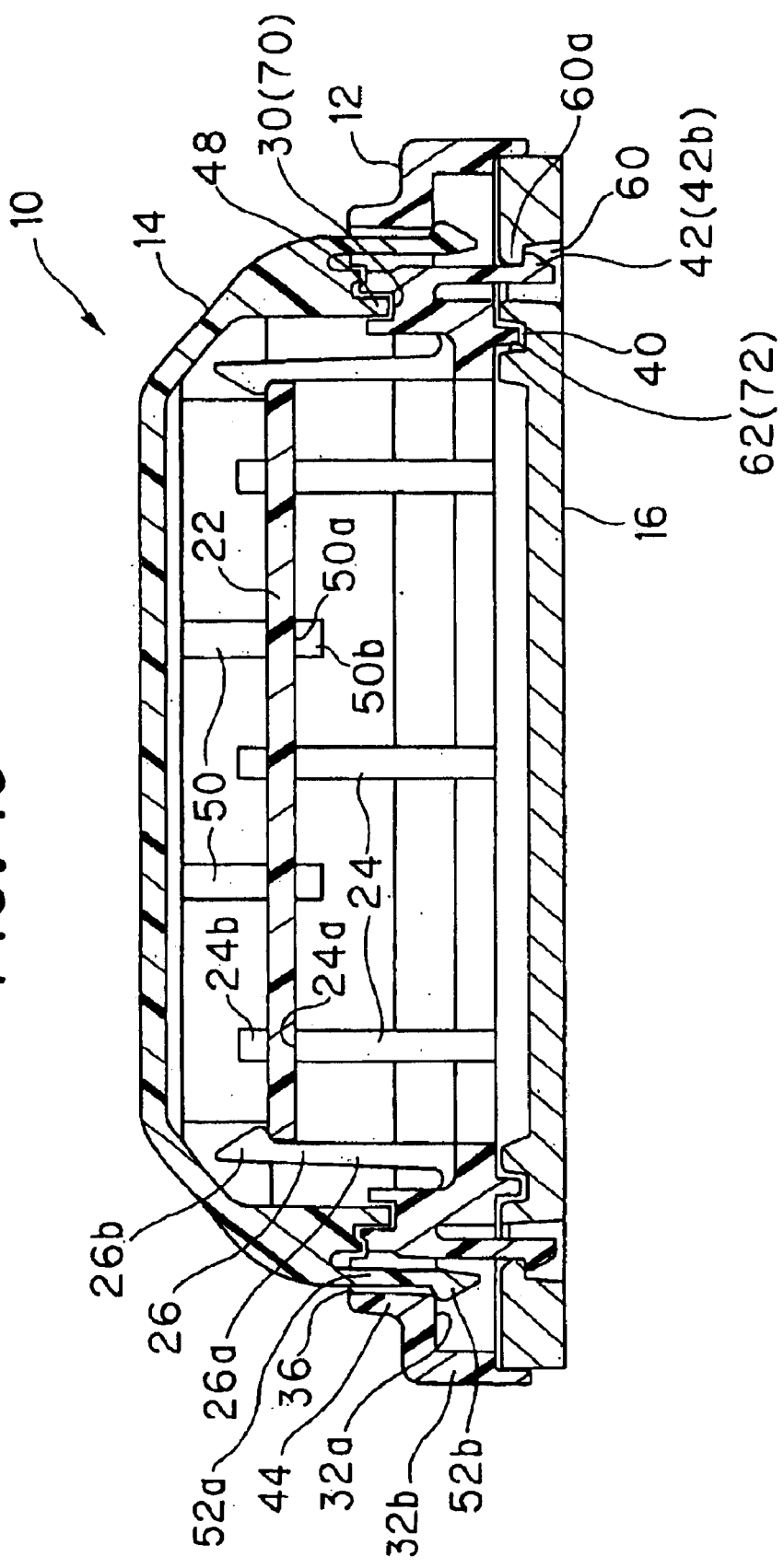
FIG. 16 is an enlarged sectional view of the case shown in FIG. 1.

FIG. 16 is a sectional view (taken at the same section as those of FIGS. 3, 4, 11 and 14) showing the fully assembled state with the board 22 housed in the case 10.

As shown in FIG. 16, the board 22 is clamped between the upper end surfaces 24a of the first ribs 24 and the projections 26b (more precisely the board contact surfaces 26b1) of the board fastening catches 26, thereby being immobilized at the prescribed location in the case 10. In addition, the cover 14 is attached to the case body 12 by engagement of the projections 52b of the cover fastening catches 52 with the first engagement holes 36, more precisely the lower surfaces 32a (the aforesaid prescribed regions) of the flanges 32.

Attachment of the cover 14 to the case body 12 further clamps the board 22 between the upper end surfaces 24a of the first ribs 24 and the lower end surfaces 50a of the second ribs 50. As a result, the board 22 is still more reliably fixed at the prescribed location.

The attachment of the heat sink 16 to the case body 12 is accomplished by engagement of the projections 42b of the heat sink fastening catches 42 formed in the case body 12 with the second engagement holes 60 formed in the heat sink 16, more precisely with the engagement portions 60a (the aforesaid prescribed regions) formed inside the second engagement holes 60, still more precisely with the corner portions of the engagement portions 60a.

Figure 17:
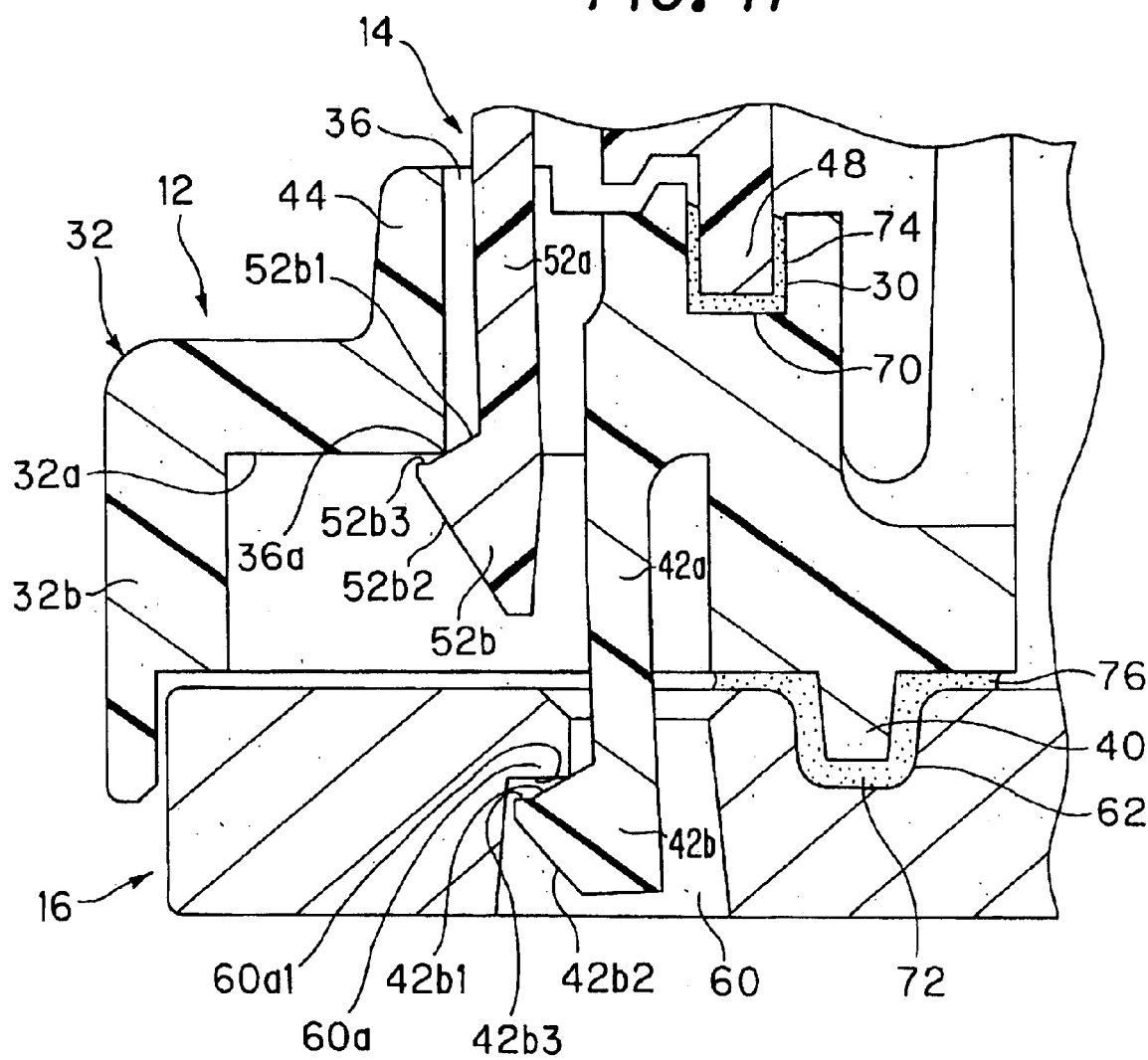
FIG. 17 is a partial enlargement of the sectional view of FIG. 16.
Figure 18:
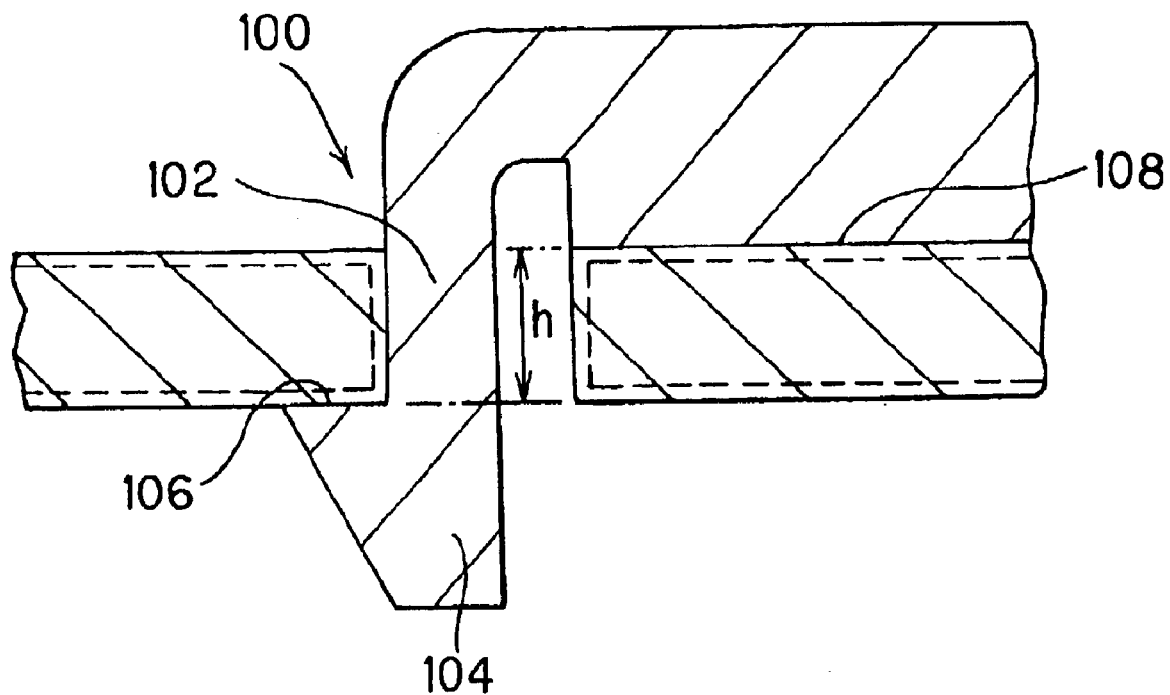
FIG. 18 is an explanatory sectional view for explaining a fastening member (catch) of a case for housing an electronic circuit board according to the prior art.

The attachment of the cover 14 and heat sink 16 to the case body 12 will be explained further with reference to FIG. 17. FIG. 17 is a partial enlarged view of FIG. 16.

The attachment of the cover 14 to the case body 12 will be explained first. The surfaces of the projection 52b and the case body contact surface 52b1 have basically the same shapes (dimensions and geometry) as the board fastening catches 26. The insertability at the time of inserting the cover 14 is therefore improved. In addition, molding error of the board 22, the case body 12 and the cover 14, their volumetric variation with temperature change, and variation in and thermal expansion of the thickness of the applied adhesive coating can be tolerated within the range of the lateral width and vertical width of the case body contact surface 52b1. Owing to the elasticity of the leg 52a, moreover, similar effects to those provided by the board fastening catch 26 can be obtained, including immobilization through reliable contact with the case body 12 (the first engagement hole 36).

The covers 44 will now be explained. As explained earlier, the covers 44 are formed to cover all or part of the legs 52a of the cover fastening catches 52. They therefore prevent a worker or anyone else from touching the legs 52a, i.e., from applying a force to a leg 52a in the direction of the case interior (in the direction enabling extraction of the projection 52b from the first engagement hole 36). Detachment of the cover 14 from the case body is therefore prevented.

The horizontal surface 52b3 will now be explained. The horizontal surface 52b3 is formed substantially parallel to the lower surface 32a of the flange 32. More specifically, the horizontal surface 52b3 is formed so as to lie substantially parallel to the lower surface 32a when the region of the case body contact surface 52b1 at or near the boundary between it and the horizontal surface 52b3 contacts the lower surface 32a of the flange 32. Therefore, when very strong vibration or thermal shock acting on the leg 52a of the cover fastening catch 52 deforms the leg 52a toward the case interior (in the direction enabling extraction of the projection 52b from the first engagement holes 36), the projection 52b is prevented from leaving the first engagement hole 36 and the cover 14 from detaching from the case body 12 because the horizontal surface 52b3 catches on the corner portion 36a of the first engagement hole 36. In other words, the tangent between the first engagement hole 36, more precisely the lower surface 32a of the flange 32 continuous therewith, and the case body contact surface 52b1 is prevented from leaving the range of the case body contact surface 52b1, meaning that the engaged state is not released. Detachment of the cover 14 from the case body 12 is therefore prevented.

Further, the second annular ridge 48 formed on the cover 14 fits into the first annular recession 30 formed on the case body 12, and thermosetting adhesive 74 applied beforehand to the first annular recession 30 spreads through a first gap 70 formed between the first annular recession 30 and the second annular ridge 48. This enhances the strength and watertightness of the case 10.

Since the engagement of the cover fastening catches 52 and the first engagement holes 36 fixes the case body 12 and the cover 14 together, no jig is required while the adhesive 74 is setting. The adhesive 74 need not be used when the degree of strength and watertightness required is not particularly high.

The attachment of the heat sink 16 to the case body 12 will now be explained. The heat sink fastening catches 42 have basically the same shape as the cover fastening catches 52. They therefore will not be explained further, other than to say that the horizontal surface 42b3 is formed parallel to the lower surface 60a1 of the engagement portion 60a. Effects like those explained with regard to the cover fastening catches 52 can also be enjoyed regarding the engagement between the heat sink fastening catches 42 and the second engagement holes 60.

Further, thermosetting adhesive 76 applied beforehand to the second annular recession 62 formed in the heat sink 16 spreads through a second gap 72 formed between the second annular recession 62 and the first annular ridge 40. This enhances the strength and watertightness of the case 10.

Since the engagement of the heat sink fastening catches 42 and the second engagement holes 60 fixes the case body 12 and the heat sink 16 together, no jig is required while the adhesive 76 is setting. The adhesive 76 need not be used when the degree of strength and watertightness required is not particularly high.

Moreover, the legs 42a of the heat sink fastening catches 42 are formed on the side wall lower surfaces 32a of the case body 12, i.e., farther toward the case interior than the side wall 32b of the flanges 32. Since this prevents someone such as a worker from touching the leg 42a, it prevents detachment of the heat sink 16 from the case body 12.

The engagement portions 60a engaged by the projections 42b are formed inside the second engagement holes 60 formed in the heat sink 16. In other words, they are formed inside the space defined by the external shape of the sink 16 at locations continuous with the external space. The heat sink 16 can therefore be prevented from separating from the case body 12 while enabling its detachment by finger-operation of the projections 42b whenever required.

The finished case 10 is installed at the desired location, such as in a vehicle engine compartment, by passing bolts (not shown) through the bolt holes 34 formed in the flanges 32 of the case body 12 and the heat sink bolt holes 58 formed in the heat sink flanges 56 of the heat sink 16. In the case of installation in an engine compartment, it is preferable to enhance the strength and watertightness of the assembly not only by fastening the assembled heat sink 16, case body 12 and cover 14 by engaging the catches as explained in the foregoing but also by bonding them together with adhesive. On the other hand, when installing the case 10 in a relatively moderate environment, such as in a vehicle passenger compartment, adequate reliability can be obtained even if the assembled heat sink 16, case body 12 and cover 14 are fastened together only by engaging the catches.

The embodiment is thus configured to have a case (10) for housing an electronic circuit board (22), including: a case body (12) formed with an opening (first and second openings 18, 20) at at least one end; and a sealing member (cover 14, heat sink 16) for sealing the opening, one of the case body and the sealing member (more specifically, the case body 12 and the cover 14) being formed with at least one fastening member (heat sink fastening catches 42, cover fastening catches 52) composed of an elastically deformable leg (42a, 52b) and a projection (42b, 52b) continuous therewith for enabling attachment of the sealing member to the case body by engagement of the fastening member with a prescribed region (lower surfaces 32a of the flanges 32, engagement portions 60a) of the other of the case body and the sealing member (more specifically, the case body 12 and the heat sink 16), wherein the improvement comprises: the projection (42b, 52b) has a first surface (heat sink contact surface 42b1, case body contact surface 52b1) that is continuous with at least the leg (42a, 52a) and formed to contact the prescribed region (32a, 60a) at a prescribe angle (more precisely, 31 to 33 degrees); and a second surface (horizontal surfaces 42b3, 52b3) that is continuous with the first surface (42b1, 52b1) and formed parallel or substantially parallel to the prescribed region (32a, 60a).

In the case, the second surface (42b3, 52b3) is formed so as to lie parallel or substantially parallel to the prescribed region when the first surface (42b1, 52b1) contacts the prescribed region (32a, 60a) at or near a boundary with the second surface.

In the case, one of the case body (12) and the sealing member (14, 16, more particularly, the case body 12) is provided with a cover (44) for covering all or part of the leg (52a) when the projection (52b) is engaged with the prescribed region (32a).

In the case, one of the case body (12) and the sealing member (14, 16, more particularly, the case body 12) is formed with the leg (52b) at a location toward a case interior from a side wall (side wall 32b of the flanges 32).

In the case, the prescribed region (60a) is a region (position; the interior of the second engagement hole 60) within a space, in one of the case body (12) and the sealing member (14, 16, more specifically, the heat sink 16), defined by an external shape of the one of the case and sealing member and continuous with an external space.

In the case, a first rib (24) is formed in the case body (12) for mounting the electronic circuit board (22) and a second rib (50) is formed in the sealing member (14, 16, more specifically, the cover 14), the first rib and the second rib clamping the electronic circuit board when the sealing member is attached to the case body.

In the case, a first recession or ridge (first annular recession 30, first annular ridge 40) is formed at the periphery of the opening of the case body, whereas a second ridge or recession (second annular ridge 48, second annular recession 62) is formed in the sealing member for meshing with the first recession or ridge so as to leave a prescribed intervening gap (first and second gaps 70, 72) at which adhesive (74, 76) can be applied.

It should be noted in the above that the projection 26b of the board fastening catch 26 may be provided with a horizontal surface.

The entire disclosure of Japanese Patent Application No. 2002-028962 filed on Feb. 6, 2002, including specification, claims, drawings and summary, is incorporated herein in its entirety.

While the invention has thus been shown and described with reference to specific embodiments, it should be noted that the invention is in no way limited to the details of the described arrangements; changes and modifications may be made without departing from the scope of the appended claims.

What is claimed is:

1. A case for housing an electronic circuit board, including:
   a case body formed with an opening at at least one end; and
   a sealing member for sealing the opening, one of the case body and the sealing member being formed with at least one fastening member composed of an elastically deformable leg and a projection continuous therewith for enabling attachment of the sealing member to the case body by engagement of the fastening member with a prescribed region of the other of the case body and the sealing member,
   wherein the improvement comprises:
      the projection has a first surface that is continuous with at least the leg and formed is slanted to contact the prescribed region at a prescribe angle; and a second surface that is continuous with the first surface and formed parallel or substantially parallel to the prescribed region.

2. A case according to claim 1, wherein the second surface is formed so as to lie parallel or substantially parallel to the prescribed region when the first surface contacts the prescribed region at or near a boundary with the second surface.

3. A case according to claim 1, wherein one of the case body and the sealing member is provided with a cover for covering all or part of the leg when the projection is engaged with the prescribed region.

4. A case according to claim 1, wherein one of the case body and the sealing member is formed with the leg at a location toward a case interior from a side wall.

5. A case according to claim 3, wherein the prescribed region is a region within a space, in one of the case body and the sealing member, defined by an external shape of the one of the case and sealing member and continuous with an external space.

6. A case according to claim 1, wherein a first rib is formed in the case body for mounting the electronic circuit board and a second rib is formed in the sealing member, the first rib and the second rib clamping the electronic circuit board when the sealing member is attached to the case body.

7. A case according to claim 1, wherein a first recession or ridge is formed at the periphery of the opening of the case body, whereas a second ridge or recession is formed in the sealing member for meshing with the first recession or ridge so as to leave a prescribed intervening gap at which adhesive can be applied.

* * * * *

UNITED STATES PATENT AND TRADEMARK OFFICE
CERTIFICATE OF CORRECTION

PATENT NO. : 6,757,155 B2
DATED : June 29, 2004
INVENTOR(S) : Tatsuo Koike et al.

It is certified that error appears in the above-identified patent and that said Letters Patent is hereby corrected as shown below:

Column 12,
Line 44, please delete "formed"

Signed and Sealed this

Twenty-first Day of December, 2004

JON W. DUDAS
*Director of the United States Patent and Trademark Office*